(12) United States Patent
Ootsuka

(10) Patent No.: US 8,970,325 B2
(45) Date of Patent: Mar. 3, 2015

(54) LAMINATED BANDPASS FILTER

(75) Inventor: Noriaki Ootsuka, Tokyo (JP)

(73) Assignee: TDK Corporation, Tokyo (JP)

( * ) Notice: Subject to any disclaimer, the term of this patent is extended or adjusted under 35 U.S.C. 154(b) by 225 days.

(21) Appl. No.: 13/578,788

(22) PCT Filed: Sep. 7, 2011

(86) PCT No.: PCT/JP2011/070400
§ 371 (c)(1),
(2), (4) Date: Aug. 13, 2012

(87) PCT Pub. No.: WO2012/033137
PCT Pub. Date: Mar. 15, 2012

(65) Prior Publication Data
US 2012/0313730 A1 Dec. 13, 2012

(30) Foreign Application Priority Data
Sep. 9, 2010 (JP) ................. 2010-201960

(51) Int. Cl.
*H03H 7/09* (2006.01)
*H03H 7/12* (2006.01)
*H01P 1/203* (2006.01)
*H03H 7/01* (2006.01)
*H03H 1/00* (2006.01)

(52) U.S. Cl.
CPC ......... *H01P 1/20345* (2013.01); *H03H 7/0123* (2013.01); *H03H 7/09* (2013.01); *H03H 7/1708* (2013.01); *H03H 7/1775* (2013.01); *H03H 2001/0085* (2013.01)
USPC ......................................... 333/185; 333/175

(58) Field of Classification Search
CPC .... H03H 2001/0085; H03H 7/09; H03H 7/12
USPC ......................................... 333/175, 176, 185
See application file for complete search history.

(56) References Cited

U.S. PATENT DOCUMENTS

| | | | | |
|---|---|---|---|---|
| 4,418,324 A | * | 11/1983 | Higgins | ................. 333/204 |
| 2010/0164651 A1 | * | 7/2010 | Erb | ................. 333/204 |
| 2013/0229241 A1 | * | 9/2013 | Imamura | ................. 333/185 |

FOREIGN PATENT DOCUMENTS

| | | |
|---|---|---|
| JP | 2 284501 | 11/1990 |
| JP | 5 199009 | 8/1993 |
| JP | 7 176907 | 7/1995 |

(Continued)

OTHER PUBLICATIONS

International Search Report Issued Dec. 13, 2011 in PCT/JP11/070400 Filed Sep. 7, 2011.

*Primary Examiner* — Benny Lee
*Assistant Examiner* — Rakesh Patel
(74) *Attorney, Agent, or Firm* — Oblon, Spivak, McClelland, Maier & Neustadt, L.L.P.

(57) ABSTRACT

A BPF comprises a first resonator and a second resonator connected in order between input/output terminals. The resonators each include an inductor conductor and a capacitor conductor formed in a laminate. The inductor conductors of both resonators have one open end and the other short-circuited end. The BPF further comprises a connection conductor for interconnecting the inductor conductors of the two resonators. This connection conductor connects the inductor conductor of the first resonator at a position close to the open end with the inductor conductor of the second resonator at a position close to the open end.

14 Claims, 18 Drawing Sheets

(56) References Cited

FOREIGN PATENT DOCUMENTS

| JP | 9 294001 | 11/1997 |
|----|----------|---------|
| JP | 10 271027 | 10/1998 |
| JP | 2000 252704 | 9/2000 |
| JP | 2004 180032 | 6/2004 |
| JP | 2006 269653 | 10/2006 |
| JP | 2007 180684 | 7/2007 |
| JP | 2008 245084 | 10/2008 |
| JP | 2004 266697 | 9/2009 |
| JP | 2009 200988 | 9/2009 |

* cited by examiner

LAMINATED BANDPASS FILTER

TECHNICAL FIELD

The present invention relates to a laminated bandpass filter, and more particularly, to a bandpass filter which comprises a coupling electrode (connection conductor) for enhancing magnetic coupling between resonators.

BACKGROUND ART

Bandpass filters (hereinafter sometimes referred to as "BPF") for selecting a frequency and removing unwanted waves have become indispensable circuit elements in high-frequency radio communication systems such as portable telephones, wireless LAN, WiMAX and the like. Such a BPF is generally provided in the form of a chip component which has a resonator formed within a laminate which comprises a plurality of wiring layers. The laminate for use therein is, for example, a ceramic laminate which has the advantage in reduction in size and higher integration. The laminate is fabricated by forming conductor patterns on the surfaces of a plurality of ceramic green sheets, then laminating them, singulating the laminated sheets into chips, and sintering the chips.

Otherwise, the following patent documents disclose such laminated BPFs.

PRIOR ART DOCUMENTS

Patent Documents

Patent Document 1: JP-A-2009-200988
Patent Document 2: JP-A-2004-266697

SUMMARY OF THE INVENTION

The BPF as described above generally comprises a plurality of resonators for forming a predetermined pass band. In order to enhance coupling between the resonators to ensure a wider pass band, several techniques may be employed, as the case may be, for arranging these resonators side by side and adjusting the interval between the resonators, or using an auxiliary coupling electrode for electrically interconnecting the resonators, and the like.

Also, with recent requests for reduction in size and thickness of electronic devices, reduction in size and profile is highly required for electronic parts which comprise these electronic devices. However, a smaller and lower-profile BPF results in a lower Q-value which in turn causes an increase in insertion loss, thereby making it more and more difficult to achieve the reduction in size and profile together with satisfactory filter characteristics. Giving an example, a typical BPF chip is approximately 1.6 mm long, 0.8 mm wide, and 0.7 mm high, and when a 2.4 GHz band laminate BPF is configured, for example, for use in wireless LAN, the insertion loss can be suppressed to approximately 1.7 dB in a conventional structure. It is desired, however, to improve the insertion loss to approximately 1.0 dB.

Further, such a request for compatibility of improvements in characteristics with reduction in size and profile seems to be more strongly made in the future, as communication devices are further advanced to provide a more variety of functions and higher performances.

It is therefore an object of the present invention to achieve satisfactory filter characteristics together with a reduction in size and profile in a laminate BPF which comprises resonators arranged in a plurality of stages. Particularly, it is an object of the invention to provide a filter structure which employs an auxiliary electrode (connection conductor) for interconnecting resonators to enhance coupling therebetween, where the coupling between the resonators is further enhanced by the connection conductor, thereby providing satisfactory filter characteristics.

To solve the aforementioned problem and achieve the object, a laminate BPF according to the present invention comprises a first resonator and a second resonator connected in order between an input terminal and an output terminal, wherein the first resonator and second resonator each include an inductor conductor and a capacitor conductor formed in a laminate having a plurality of wiring layers insulated from one another, and the inductor conductor of the first resonator (hereinafter sometimes referred to as the "first inductor conductor" or "first inductor") and the inductor conductor of the second resonator (hereinafter sometimes referred to as the "second inductor conductor" or "second conductor") are each configured with one open end and the other short-circuited end. The laminated bandpass filter comprises a connection conductor for electrically connecting the inductor conductor of the first resonator with the inductor conductor of the second resonator, wherein the connection conductor connects a position close to the open end of the inductor conductor of the first resonator with a position close to the open end of the inductor conductor of the second resonator.

A structure for electrically connecting a first inductor conductor (inductor conductor of the first resonator) with a second inductor conductor (inductor conductor of the second resonator) through a connection conductor has been known in the past in order to enhance magnetic coupling of the resonators and adjust a band in a laminated BPF including a plurality of resonators. On the other hand, the inventors repeatedly made investigations on BPFs which employed such a connection conductor for band adjustment, and eventually reached the completion of the invention.

Specifically, resonators have been generally interconnected through a connection conductor near short-circuited ends thereof. However, the inventors found that when the interconnection through the connection conductor is made near open ends of the respective inductor conductors, an insertion loss can be improved while ensuring a wide pass band. Accordingly, in the present invention, the BPF comprises a connection conductor for electrically connecting a position close to the open end of the first inductor conductor (closer to the open end than to the middle point of the inductor conductor) with a position closer to the open end of the second inductor conductor (closer to the open end than to the middle point of the inductor conductor), as described above. In this regard, the effects resulting from such improvement in characteristics will be described in greater detail based on the results of simulations in Description of Embodiment below.

Further, the open end, which is one end of the first inductor conductor, is connected to the input terminal (may be connected through an input capacitor), and the short-circuited end, which is the other end of the first inductor conductor, is connected to the ground. Likewise, the open end, which is one end of the second inductor conductor, is connected to the output terminal (may be connected through an output capacitor), and the short-circuited end, which is the other end of the second inductor conductor, is connected to the ground.

Also, in regard to the positions at which the connection conductor is connected, in one aspect of the present invention, the connection conductor is disposed to electrically connect the open end of the inductor conductor of the first resonator or a position close thereto with the open end of the inductor conductor of the second resonator or a position close thereto.

In another aspect of the present invention, the distance from the position at which the connection conductor is connected to the inductor conductor of the first resonator to the open end of the inductor conductor of the first resonator is equal to or less than ⅜ of the total length of the inductor conductor of the first resonator, and the distance from the position at which the connection conductor is connected to the inductor conductor of the second resonator to the open end of the inductor conductor of the second resonator is equal to or less than ⅜ of the total length of the inductor conductor of the second resonator.

Further, as a preferred aspect of the present invention, the inductor conductor of the first resonator and the inductor conductor of the second resonator are arranged to be adjacent to each other on the same internal wiring layer of the laminate when viewed in plan, such that the inductor conductors are magnetically coupled to each other.

Also, while the connection conductor can be disposed on the same wiring layer as the inductor conductors, the connection conductor is preferably disposed on a wiring layer different from those wiring layers on which the inductor conductor of the first resonator and the inductor conductor of the second resonator are disposed within the laminate, from a viewpoint of reduction in size of filter chip.

Further, in another aspect of the present invention, the input terminal and the output terminal are disposed on a bottom wiring layer which is the lowermost wiring layer of the laminate, the inductor conductor of the first resonator and the inductor conductor of the second resonator are disposed on internal wiring layers of the laminate, a capacitor conductor of the first resonator (hereinafter sometimes referred to as the "first capacitor conductor" or "first capacitor") and a capacitor conductor of the second resonator (hereinafter sometimes referred to as the "second capacitor conductor" or "second Capacitor") are disposed on internal wiring layers lower than the inner wiring layers on which the inductor conductor of the first resonator and the inductor conductor of the second resonator are disposed, and the connection conductor is disposed on an internal wiring layer higher than the internal wiring layers on which the inductor conductor of the first resonator and the inductor conductor of the second resonator are disposed.

As will be made apparent in Description of Embodiments below, more satisfactory insertion loss characteristic can be achieved as the connection conductor is connected at positions closer to the open ends of the inductor conductors, however, through conductors such as vias may be provided at the open ends of the inductor conductors for making connections with input/output terminal electrodes, input/output capacitors, and the like. In other instances, in order to maintain high product qualities and pursuing a higher efficiency for designing, certain rules are often predefined for designing and manufacturing of electronic devices, and a principle of placing a conductor pattern at a certain distance away from a through conductor may be defined as one of such design rules.

In regard to such a design rule, according to the aforementioned aspect where the input/output terminals and the capacitor conductors which form part of the respective resonators are disposed on layers lower than the inductor conductors, while the connection conductor is disposed on a layer higher than the inductor conductors, the through conductors for connecting the inductor conductors to the input/output terminals and capacitor conductors are disposed separately from the connection conductor across the wiring layers on which the inductor conductors are disposed, where the through conductors are positioned above the wiring layers, while the connection conductor is positioned below the wiring layers. Accordingly, even if the connection conductor is connected at the open ends of the inductor conductors or at positions close to the open ends, this arrangement will not infringe on the aforementioned design rule which defines the distance between the through conductor and conductor pattern (connection conductor), thus making it possible to realize efficient designing and manufacturing pursuant to such existing design rules, and making it possible to prevent unintended short-circuiting from occurring between the through conductor and connection conductor.

Also, in another aspect of the present invention, the inductor conductor of the first resonator and the inductor conductor of the second resonator, as well as the connection conductor is arranged such that the inductor conductors at least partially overlap with the connection conductor when viewed in plan, and the connection conductor has a line width which is smaller than the line width of the inductor conductor of the first resonator and the inductor conductor of the second resonator.

By thus reducing the connection conductor in line width, it is possible to prevent the connection conductor from impeding a magnetic field generated by the respective inductor conductors of the first resonator and second resonator, allowing the filter characteristics to be further improved.

Also, from a viewpoint of preventing the impediment of the magnetic field generated by the inductor conductors, the connection conductor may be arranged such that the connection conductor does not overlap with the inductor conductor of the first resonator nor the inductor conductor of the second resonator when viewed in plan.

Further, in the BPF of the present invention, the inductor conductor of the first resonator and the inductor conductor of the second resonator may each comprise a quarter wavelength line having a generally loop-like shape, and the inductor conductors may be arranged adjacent to each other on the same internal wiring layer of the laminate such that the inductor conductors magnetically couple to each other.

While a typical example of the present invention comprises (two) resonators at two stages, a BFP comprising resonators at three or more stages can also be created based on the present invention. Such a BPF comprises one or more resonator connected between the first resonator and the second resonator, wherein a pass band is formed by the first resonator, second resonator, and one or more resonator.

The present invention is not particularly limited in frequency band. While a BPF is configured in assumption of a 2.4 GHz band for use in wireless LAN and the like in embodiments later described, the BPF according to the present invention is not limited to this frequency band (pass band)but may be applicable, for example, to 800-MHz band, 1.5-GHz band, 1.7-GHz band, and 2-GHz band for use by a variety of portable telephones, or 1.9-GHz band and 1.8-GHz band for use by PHS, or a variety of frequency bands other than those.

Also, the BPF according to the present invention is typically provided as a discrete component which comprises a single filter as a one-chip device, but is not limited to such an implementation. For example, an electronic module may be created to further contain a variety of circuit elements other than the filter, and electronic components such as ICs within laminated substrates. Alternatively, a plurality of filters may be contained within a laminate to create a communication module for use in two or more frequency bands (dual-band module, triple-band module, and the like). A variety of other implementations may also be contemplated. Further, the BPF of the present invention and an electronic module including the BPF of the present invention as described above may also be used by a variety of communication systems such as wireless LAN, portable telephones, WiMAX, Bluetooth, and the like, whichever type may be.

EFFECTS OF THE INVENTION

According to the present invention, satisfactory filter characteristics can be achieved by enhancing mutual coupling of resonators in a laminated bandpass filter which comprises a plurality of resonators.

Other objects, features, and advantages of the present invention will be made apparent from the following description of embodiments of the present invention, made in conjunction of the drawings. In the following description of embodiments, the same or comparable elements are designated the same reference numerals, and repeated descriptions will be omitted.

BEST MODE FOR CARRYING OUT THE INVENTION

[First Embodiment]

Figure 1:
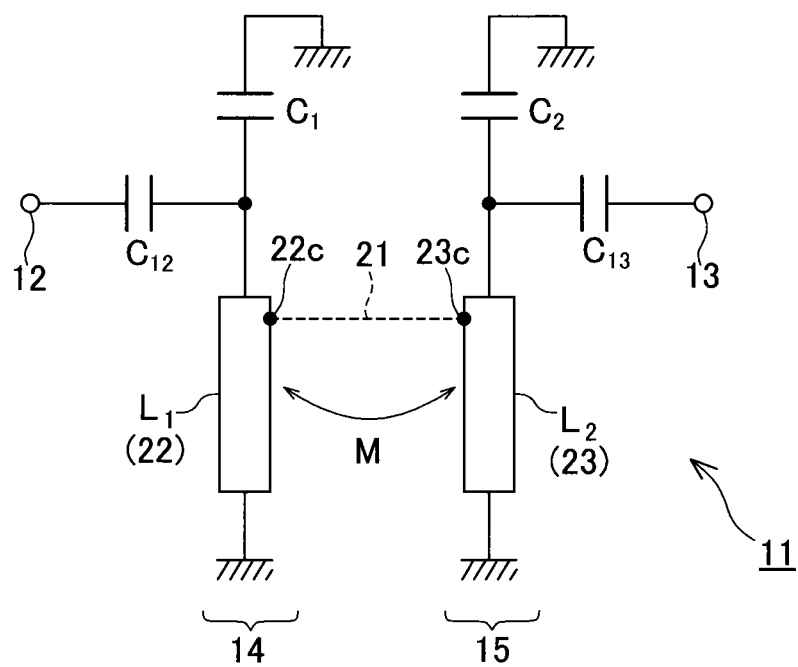
FIG. 1 is a diagram showing an equivalent circuit for a laminate BPF according to a first embodiment of the present invention.
Figure 2:
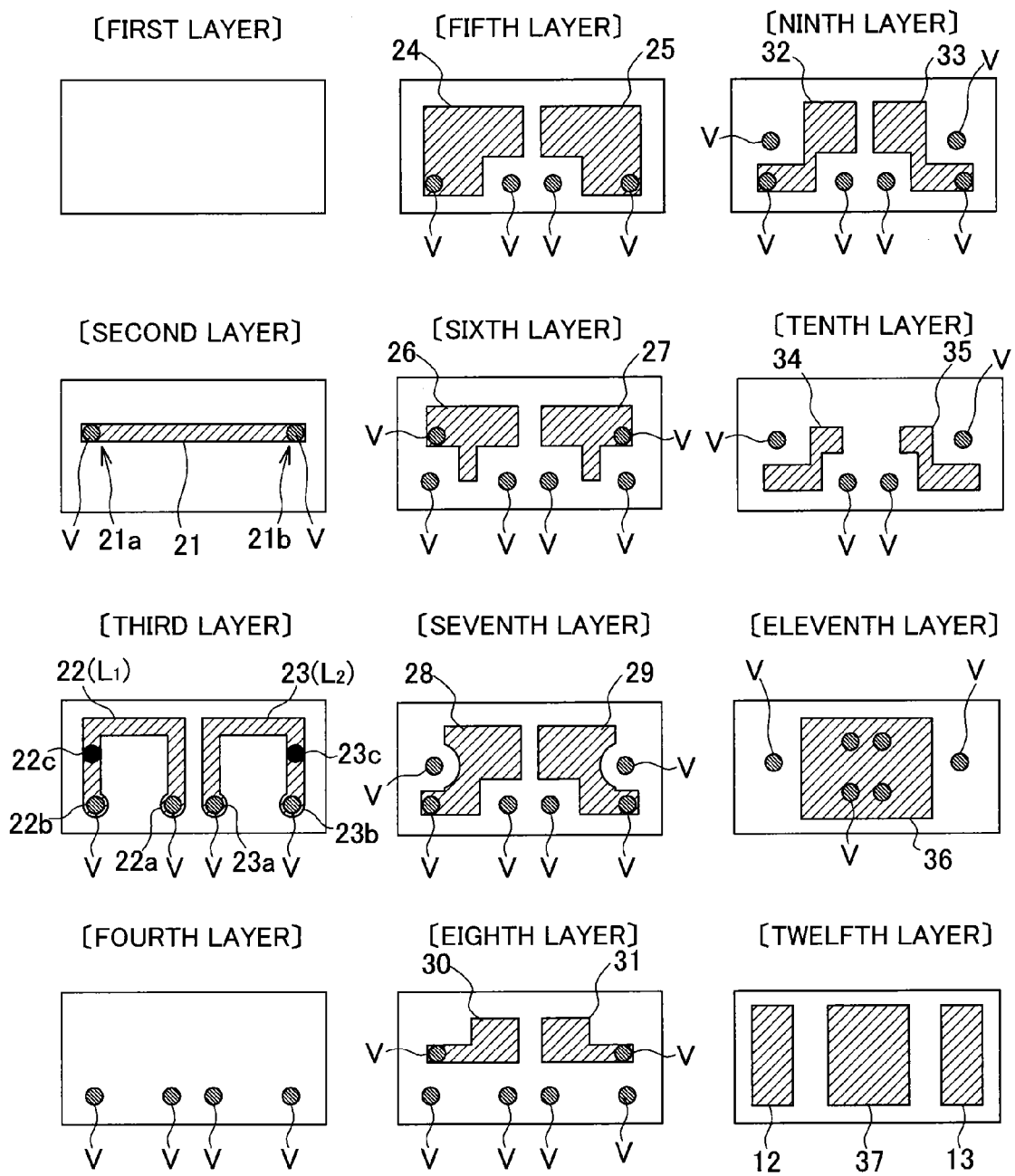
FIG. 2 is a diagram showing a laminated structure (each wiring layer of a laminate, a first through a twelfth layer) of the BPF according to the first embodiment.

As shown in FIGS. 1-2, a laminated BPF (hereinafter sometimes referred to as the "chip") 11 according to a first embodiment of the present invention comprises two resonators 14, 15 connected in order between an input terminal 12 and an output terminal 13 for forming a predetermined pass band (referred to as a "first resonator" and a "second resonator" in order from the input terminal 12 toward the output terminal 13); a connection conductor 21 for interconnecting these first resonator 14 and second resonator 15; an input capacitor C12 connected between the input terminal 12 and first resonator 14; and an output capacitor C13 connected between the output terminal 13 and second resonator 15.

The first resonator 14 and second resonator 15 are both LC parallel resonators, each of which is made up of an inductor (first inductor) L1 and a capacitor (first capacitor) C1, or an inductor (second inductor) L2 and a capacitor (second capacitor) C2, respectively. Also, respective conductors which comprise these first inductor L1, second inductor L2, first capacitor C1, second capacitor C2, input capacitor C12, and output capacitor C13 are implemented by conductor patterns 22-35, respectively, which are formed on respective wiring layers of a ceramic laminate which has 12 wiring layers including a back face (twelfth layer), as shown in FIG. 2.

Notably, the laminate can be created by laminating a plurality of ceramic green sheets, each having a conductor pattern corresponding to each wiring layer printed on the surface thereof, forming the resulting laminate into chips, and sintering the chips. Also, in this embodiment (also applied to a second and subsequent embodiments later described), the top of the chip (laminate) is designated as a first layer, and lower layers are designated as a second layer, a third layer, a fourth layer, . . . , in order toward the bottom of the chip, with the bottom of the chip being designated as a twelfth layer. Also, in FIG. 2, a circle labeled "V" represents a via, and indicates that a wiring layer is electrically connected to a wiring layer on the next lower layer (also applied to each figure later described). Also, a solid black circle represents a position at which a connection conductor 21 is connected through a via V (see FIGS. 2, 12, 20, 21, and 23).

The second layer of the laminate is provided with a connection conductor (coupling electrode) 21 for electrically interconnecting the first inductor L1 (22) and second inductor L2 (23) disposed on the third layer, later described, and coupling both inductors L1, L2 (22, 23). The first inductor 22 and second inductor 23 are also arranged on the third layer. Each of the first inductor 22 and second inductor 23 comprises a conductor line having a line length of one quarter wavelength (one-quarter wavelength resonator) which is wound into a loop shape to have an inverted-C shape, when viewed in plan. Then, these first inductor 22 and second inductor 23 are arranged side by side and in close proximity to each other such that these inductors 22, 23 are magnetically coupled to each other.

One end of the first inductor 22 is left open, and this open end is labeled 22b. Specifically, this open end 22b is electrically connected to capacitor electrodes 24, 28, 32, 34 disposed on the fifth layer, seventh layer, ninth layer, and tenth layer, respectively, through vias V. On the other hand, the other end of the first inductor 22 is short-circuited, and this short-circuited end is labeled 22a and is connected to a ground electrode 36 disposed on the eleventh layer through vias V. The second inductor 23 is also connected in a similar manner to the first inductor 22. Specifically, one end of the second inductor 23, which serves as an open end 23b, is electrically connected to capacitor electrodes 25, 29, 33, 35 disposed on the fifth layer, seventh layer, ninth layer, and tenth layer, respectively, through the vias V. On the other hand, the other end of the second inductor 23, which serves as a short-circuited end 23a, is connected to the ground electrode 36 disposed on the eleventh layer, through the vias V.

Notably, in this embodiment, the first inductor 22 and second inductor 23 are arranged side by side in a longitudinal direction of the chip, i.e., left to right in FIG. 2, where the arrangement is such that the respective short-circuited ends 22a, 23a are positioned in a middle area in the direction in which the first inductor 22 and second inductor 23 are arranged (in the longitudinal direction of the chip), and such that the respective open ends 22a, 23b are positioned in a peripheral area in the direction in which the inductors 22, 23 are arranged.

Then, the one end 21a of the connection conductor 21 on the second layer is connected to a position 22c close to the open end 22b of the first inductor 22 through via V, while the other end 21b of the connection conductor 21 is connected to a position 23c close to the open end 23b of the second inductor 23 through via V, thereby interconnecting both inductors 22, 23. In this way, the coupling can be enhanced between the first inductor 22 and second inductor 23. In this regard, the distance from the open end 22b of the first inductor 22 to the position 22c at which the connection conductor 21 is connected to the first inductor 22 is equal to the distance from the open end 23b of the second inductor 23 to the position 23c at which the connection conductor 21 is connected to the second inductor 23, where the distance is set to ⅜ of the total length of each inductor conductor 22, 23. A description will be later given to the basis on which the respective inductors 22, 23 are thus connected at the positions close to the open ends 22b, 23b.

On each of the fifth layer through tenth layer, two capacitor electrodes 24, 25; 26, 27; 28, 29; 30, 31; 32, 33; 34, 35 are arranged side by side. Among these capacitor electrodes 24-35, electrodes 24, 26, 28, 30, 32 arranged on the left side on the fifth layer through ninth layers overlap one another, when viewed in plan, so that these electrodes 24, 26, 28, 30, 32 comprise the input capacitor C12.

Specifically, the capacitor electrodes 26, 30 respectively arranged on the left side on the sixth and eight layers are connected to the input terminal 12 disposed in one side area (left side area) of the twelfth layer (bottom of the chip) through the vias V, while the capacitor electrodes 28, 32 respectively arranged on the left side on the fifth layer, seventh layer, and ninth layer are connected to the open end 22b of the first inductor 22 disposed on the third layer through the vias V. Consequently, the left-hand capacitor electrode 24 on the fifth layer and left-hand capacitor electrode 26 on the sixth layer, the left-hand capacitor electrode 26 on the sixth layer and left-hand capacitor 28 on the seventh layer, the left-hand capacitor electrode 28 of the seventh layer and the left-hand capacitor electrode 30 on the eighth layer, and the left-hand capacitor 30 on the eighth layer and left-hand capacitor electrode 32 on the ninth layer comprise the input capacitor C12.

On the other hand, the capacitor electrodes 25, 27, 29, 31, 33 respectively arranged on the right side on the fifth layer through ninth layer overlap one another, when viewed in plan, and comprise the output capacitor C13.

Specifically, the capacitor electrodes 27, 31 respectively arranged on the right side of the sixth layer and eighth layer are connected to the output terminal 13 disposed in the other side area (right side area) on the twelfth layer (bottom of the chip) through the vias V, while the capacitor electrodes 25, 29, 33 respectively arranged on the right side of the fifth layer, seventh layer, and ninth layer are connected to the open end 23b of the second inductor 23 disposed on the third layer through the vias V. Consequently, the right-hand capacitor electrode 25 on the fifth layer and the right-hand capacitor electrode 27 on the sixth layer, the right-hand capacitor electrode 27 on the sixth layer and the right-hand capacitor electrode 29 on the seventh layer, the right-hand capacitor electrode 29 on the seventh layer and the right-hand capacitor electrode 31 on the eighth layer, and the right-hand capacitor electrode 31 on the eighth layer and the right-hand capacitor electrode 33 on the ninth layer comprise the output capacitor C13.

Also, the ground electrode 36 is disposed in a middle area of the eleventh layer. This ground electrode 36 is placed to be opposite to the left-hand capacitor electrode 34 on the tenth layer, and the ground electrode 36 is also placed to be opposite to the left-hand capacitor electrode 32 on the ninth layer, so that the first capacitor C1 is made up of these electrodes 32, 34, 36. Additionally, the left-hand capacitor electrode 32 on the ninth layer and the left-hand capacitor electrode 34 on the tenth layer are connected to the open end 22b of the first inductor 22 on the third layer, and to the respective left-hand capacitor electrodes 24, 28, 32 on the fifth layer, seventh layer, and ninth layer through the vias V. Also, the ground electrode 36 on the eleventh layer is connected to a ground terminal 37 provided in a middle area of the twelfth layer for external connection through via V.

Likewise, the ground electrode 36 on the eleventh layer is placed to be opposite to the right-hand capacitor electrode 35 on the tenth layer, and the ground electrode 36 is also placed to be opposite to the right-hand capacitor electrode 33 on the ninth layer, so that the second capacitor C2 is made up of these electrodes 33, 35, 36. Additionally, the right-hand capacitor electrode 33 on the ninth layer and the right-hand capacitor electrode 35 on the tenth layer are connected to the open end 23b of the second inductor 23 on the third layer, and to the respective right-hand capacitor electrodes 25, 29, 33 on the fifth layer, seventh layer, and ninth layer through the vias V.

Further, the twelfth layer, which is the bottom of the chip, is provided with the input terminal 12 in a left-side area, the output terminal 13 in a right-side area, and the ground terminal 37 in a middle area, respectively, as described above.

Figure 3:
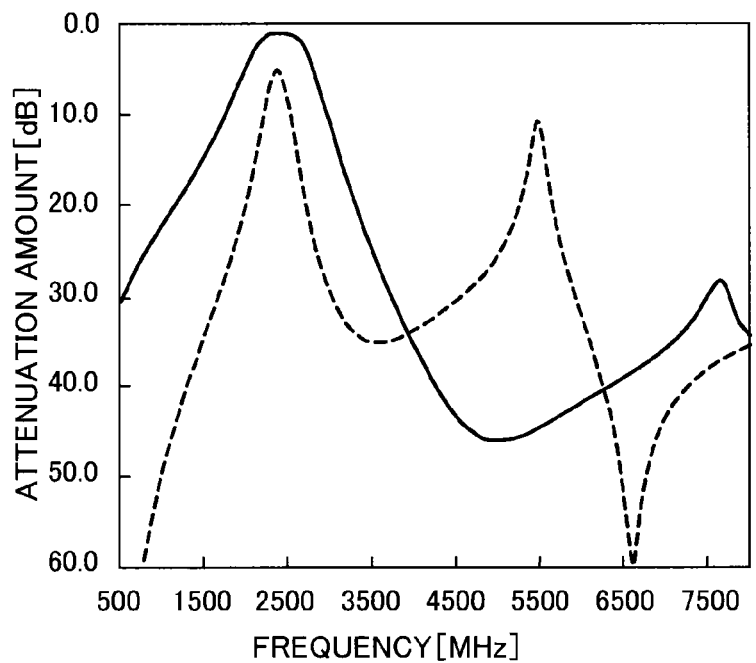
FIG. 3 is a graph representing a frequency-attenuation characteristic of the BPF according to the first embodiment.
Figure 4:
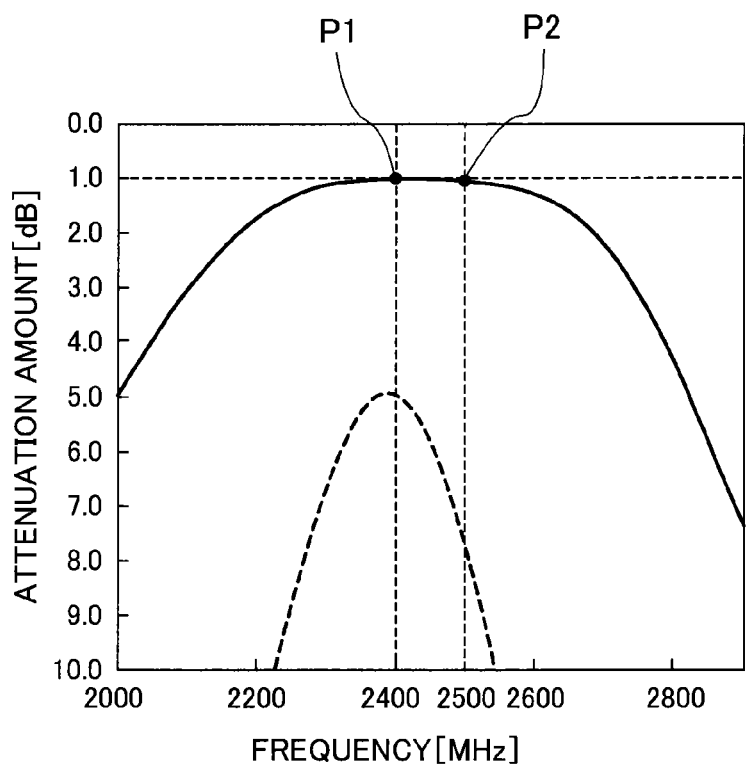
FIG. 4 is a graph representing a frequency-insertion loss characteristic in a pass band of the BPF according to the first embodiment.
Figure 5:
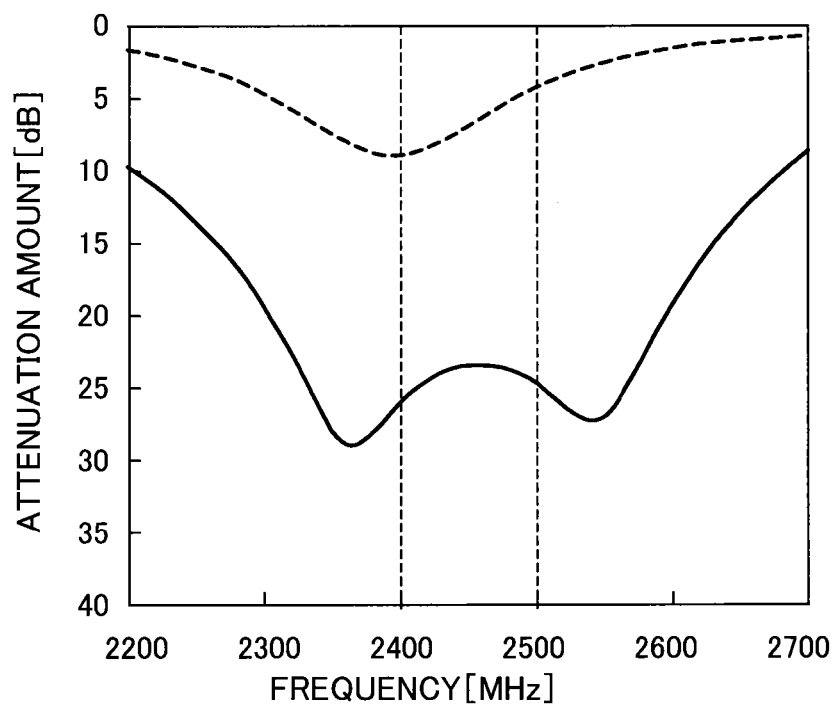
FIG. 5 is a graph representing a frequency-reflection loss characteristic in the pass band of the BPF according to the first embodiment.

According to the BPF of this embodiment as described above, as shown in FIGS. 3 through 5 (solid lines represent characteristics of this embodiment, which exhibit 1.01 dB at point P1 indicating the frequency of 2400 MHz, and 1.06 dB at point P2 indicating the frequency of 2500 MHz in FIG. 4), it is possible to achieve a satisfactory insertion loss of approximately 1 dB in the pass band. Also, broken lines in these figures represent the characteristics which are demonstrated when a short-circuited end of a BPF disclosed in FIG. 4 of the aforementioned Patent Document 1 (JP-A-2009-200988) is connected with a connection conductor. In comparison with these characteristics, it can be seen that the BPF of this embodiment can provide a wider pass band and more satisfactory insertion loss characteristic.

[Influence on Characteristics by Connected Position of Connection Conductor]

Investigations were made on influences which would be resulted when the connection conductor was connected at various positions in the present invention.

Specifically, in the BPF of the first embodiment, the first inductor 22 and second inductor 23 were equally divided into eight sections from the short-circuited ends 22a, 23a to the open ends 22b, 23b along their conductor lines 22, 23 (each inductor has a total length of $\lambda/4$, where $\lambda$ represents the wavelength). Then, the insertion loss values were compared for the inductors 22, 23 which were connected to each other at respective positions ((a)-(i) in FIG. 6).

Figure 6:
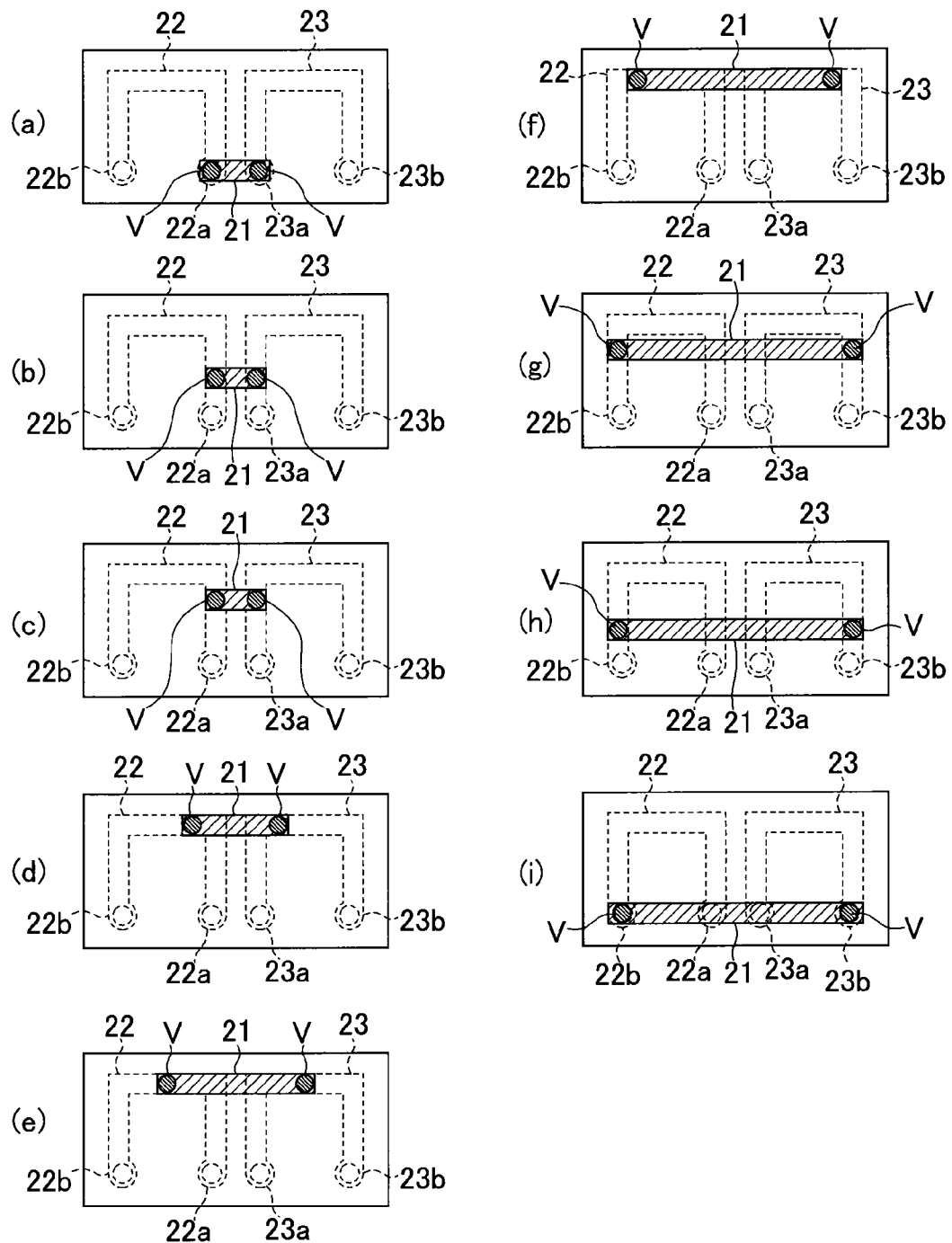
FIG. 6 is a plan view showing where connection conductors are connected.

Specifically, the insertion loss values were compared when the short-circuited ends 22a, 23a were connected with each other as shown in FIG. 6(*a*); when the conductors 22, 23 were connected with each other at positions advanced away from the short-circuited ends towards the open ends by $(1/32)*\lambda$ along the inductor conductors 22, 23 as shown in FIG. 6(*b*); when the conductors 22, 23 were connected with each other at positions advanced away from the short-circuited ends towards the open ends by $(2/32)*\lambda$ along the inductor conductors 22, 23 as shown in FIG. 6(*c*); when the conductors 22, 23 were connected with each other at positions advanced away from the short-circuited ends towards the open ends by $(3/32)*\lambda$ along the inductor conductors 22, 23 as shown in FIG. 6(*d*); when the conductors 22, 23 were connected with each other at positions advanced away from the short-circuited ends towards the open ends by $(4/32)*\lambda$ along the inductor conductors 22, 23 as shown in FIG. 6(*e*); when the conductors 22, 23 were connected with each other at positions advanced away from the short-circuited ends towards the open ends by $(5/32)*\lambda$ along the inductor conductors 22, 23 as shown in FIG. 6(*f*); when the conductors 22, 23 were connected with each other at positions advanced away from the short-circuited ends towards the open ends by $(6/32)*\lambda$ along the inductor conductors 22, 23 as shown in FIG. 6(*g*); when the conductors 22, 23 were connected with each other at positions advanced away from the short-circuited ends towards the open ends by $(7/32)*\lambda$ along the inductor conductors 22, 23 as shown in FIG. 6(*h*); and when the conductors 22, 23 were connected with each other at positions advanced away from the short-circuited ends towards the open ends by $(8/32)*\lambda$ along the inductor conductors 22, 23 as shown in FIG. 6(*i*).

Figure 7:
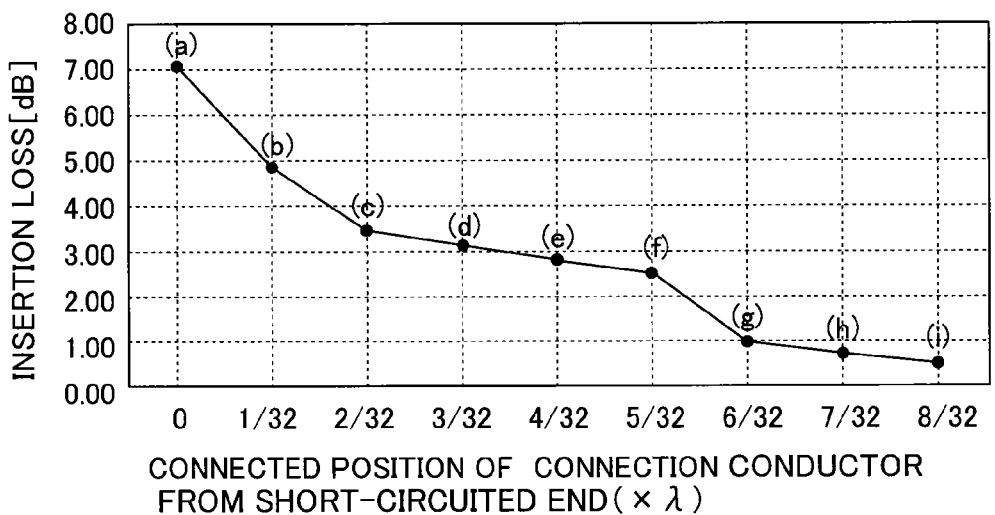
FIG. 7 is a graph representing a change in peak value of insertion loss when a connection conductor is connected at different positions.

The results are as shown in FIG. 7, from which it is understood that a more satisfactory insertion loss characteristic can be ensued as the inductors 22, 23 are connected at positions closer to the open ends 22b, 23b. Particularly, as shown in FIGS. 6(*f*) through 6(*i*), the connection conductor 21 is preferably connected at positions closer to the open ends 22b, 23b, by $(5/32)*\lambda$ from the short-circuited ends 22a, 23a (i.e., 5/8 or more of the total length of the inductor conductors 22, 23), in other words, the distance between the connected position of the connection conductor 21 to the open end 22b, 23b should be set to 3/8 or less of the total length of the inductor 22, 23 in order to provide satisfactory filter characteristics. More preferably, as shown in FIGS. 6(*g*) through 6(*i*), the distance between the connected position of the connection conductor and the open end 22b, 23b should be set to 2/8 (=1/4) or less of the total length of the inductor 22, 23.

Figure 8:
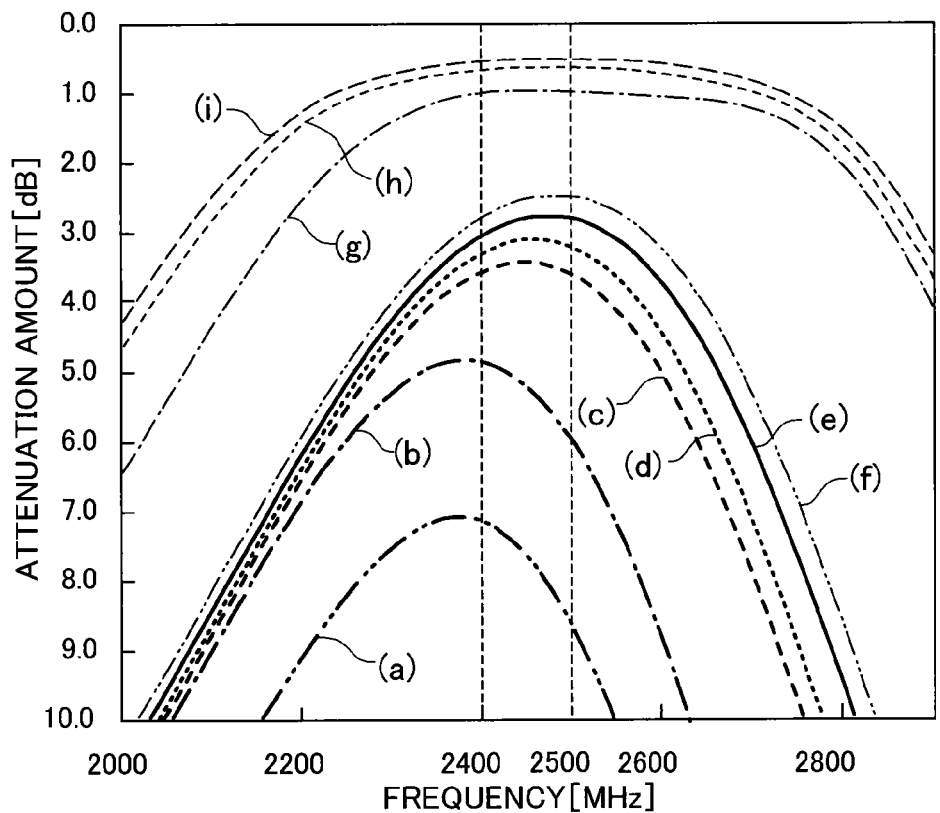
FIG. 8 is a graph representing a frequency-insertion loss characteristic when the connection conductor is connected at different positions.

FIG. 8 in turn is a graph representing the insertion loss in the pass band for each of the connections shown in FIG. 6(*a*) through 6(*i*). In FIG. 8, graphs are labeled characters (*a*)-(*i*), corresponding to FIGS. 6(*a*)-6(*i*). As is apparent from FIG. 8, it is understood that connecting the inductors 22, 23 with each other at positions closest possible to the open ends 22b, 23b results in a broader band and more satisfactory insertion loss.

[Influence by Line Width of Connection Conductor]

Figure 9A:
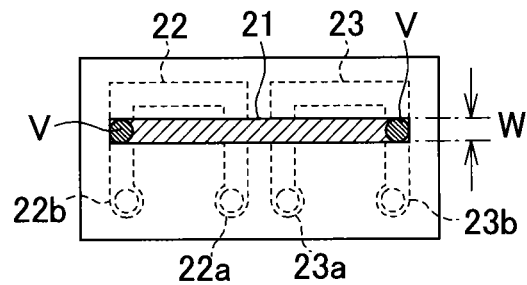
FIG. 9A is a plan view showing the width of a connection conductor in the BPF according to the first embodiment.
Figure 9B:
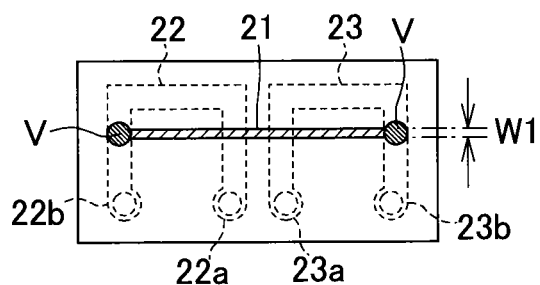
FIG. 9B is a plan view showing a connection conductor with a reduced width in the BPF according to the first embodiment.
Figure 9C:
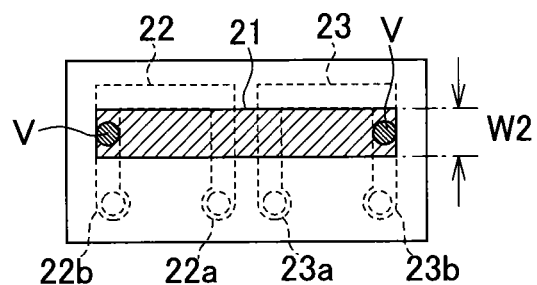
FIG. 9C is a plan view showing a connection conductor with an extended width in the BPF according to the first embodiment.

Further, in the BPF of the first embodiment, investigations were made on the influence on the characteristics which would be resulted when the line width of the connection conductor 21 was varied. Specifically, the characteristics were compared when the line width of the connection conductor 21 was the same as that of the inductors 22, 23 (W=135 μm), as in the BPF of the first embodiment, as shown in FIG. 9A, when the width of the connection conductor 21 was reduced (W1=50 μm) as shown in FIG. 9B, and when the width was extended (W2=270 μm) as shown in FIG. 9C.

Figure 10:
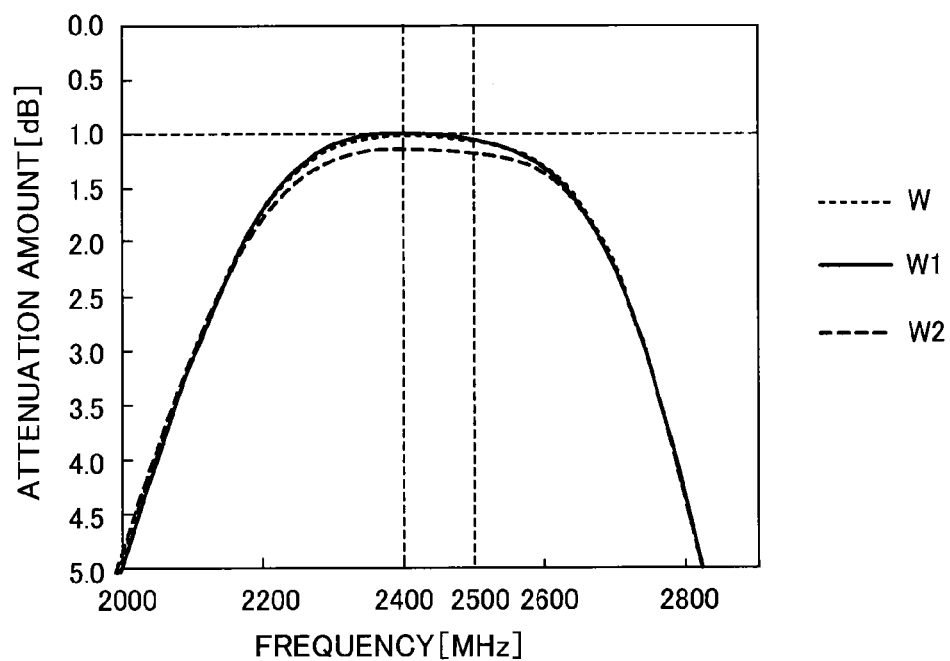
FIG. 10 is a graph representing a frequency-insertion loss characteristic when the connection conductor is changed in width as shown in FIGS. 9A-9C.
Figure 11:
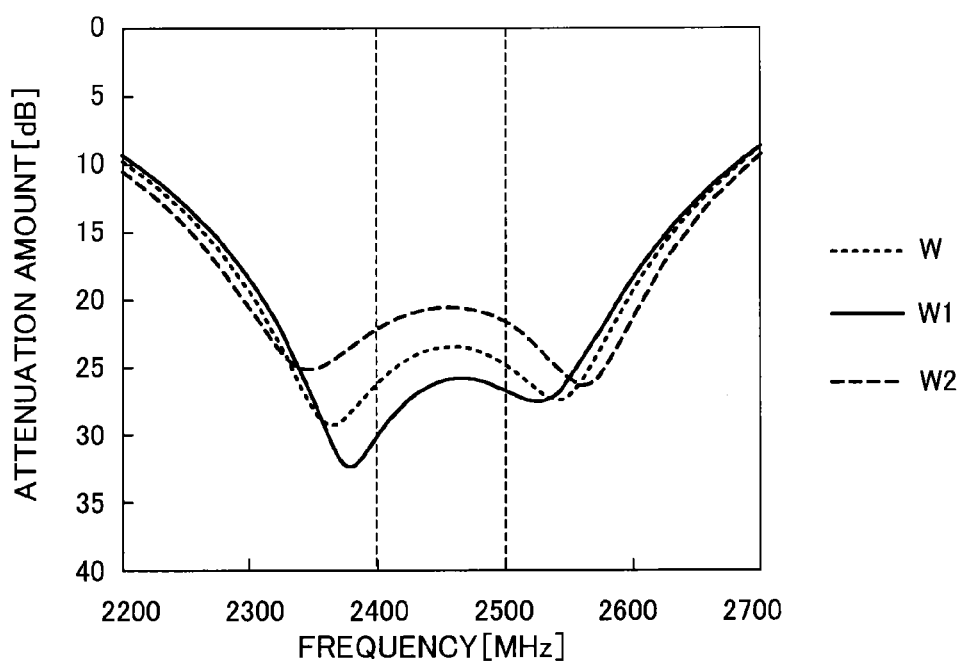
FIG. 11 is a graph representing a frequency-reflection loss characteristic when the connection conductor is changed in width as shown in FIGS. 9A-9C.

The results are as shown in FIG. 10 (insertion loss) and FIG. 11 (reflection loss), wherein dotted lines represent the characteristics when the connection conductor has the same width W as the inductor conductor (FIG. 9A), solid lines represent the characteristics when the connection conductor has a smaller width W1 (FIG. 9B), and broken lines represent the characteristics when the connection conductor has a larger width W2 (FIG. 9C), respectively. As is apparent from these graphs, the connection conductor 21 is preferably reduced in width (thinner) in order to provide more satisfactory characteristics.

[Second Embodiment]

Figure 12:
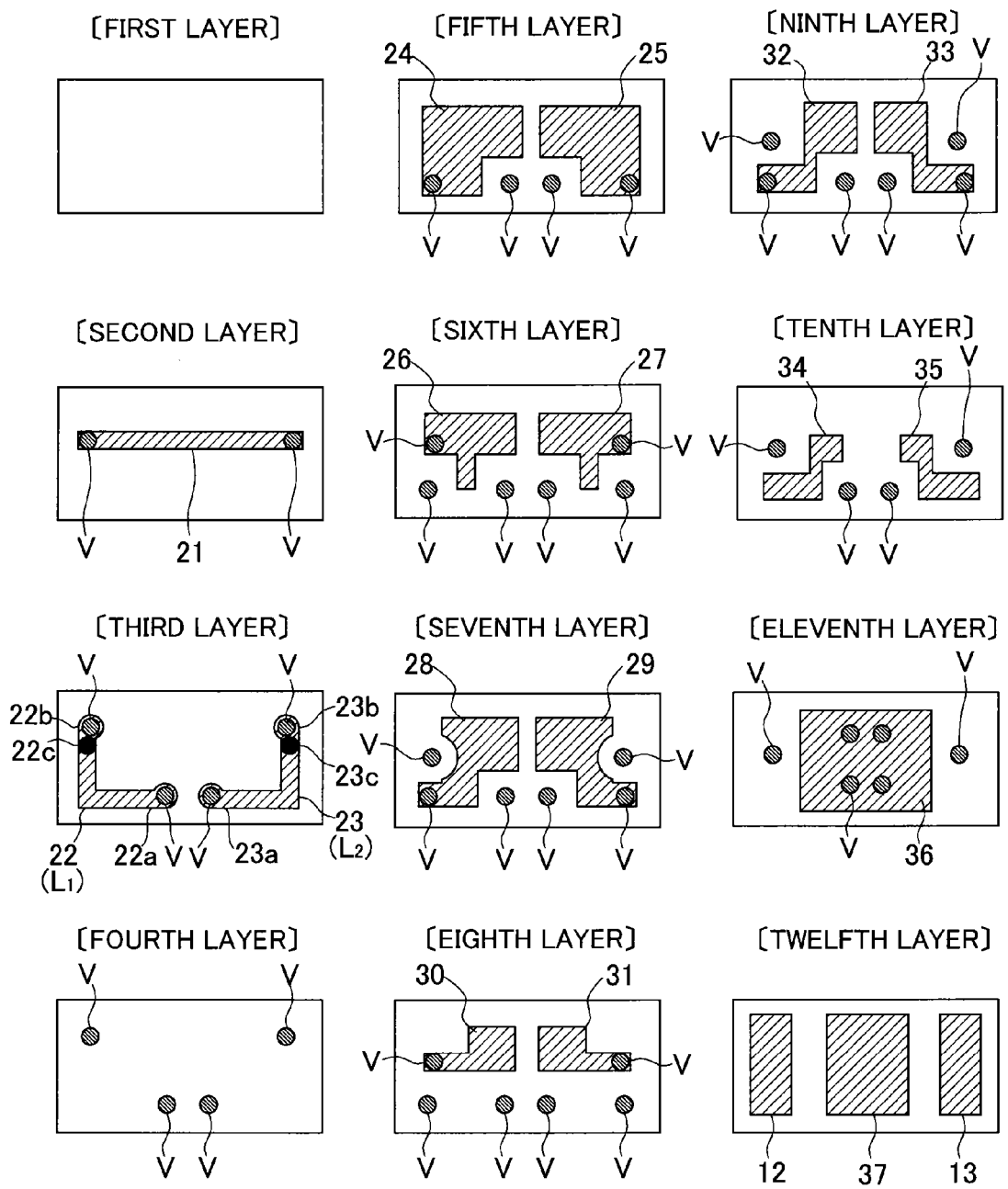
FIG. 12 is a diagram showing a laminated structure (each wiring layer of a laminate, a first through a twelfth layer) of a laminated BPF according to a second embodiment of the present invention.

A BPF according to a second embodiment of the present invention comprises LC resonators at two stages, and a connection conductor for interconnecting inductors of the respective resonators, in a manner similar to the BPF according to the first embodiment, but the first inductor 22 and second inductor 23, which form part of the respective resonators, are formed of L-shaped conductor lines, as shown in FIG. 12 (third layer).

Additionally, short-circuited ends 22a, 23a of the respective inductors 22, 23 are disposed in a marginal area included in a middle zone of the layer (in a lower marginal area in FIG. 12) in the longitudinal direction of the chip, as is the case with the first embodiment, while open ends 22b, 23b are disposed at a top left corner and at a top right corner, respectively. Then, the first inductor 22 and second inductor 23 are interconnected by a connection conductor 21 through vias V at positions 22c, 23c close to the open ends 22b, 23b. Since electrodes (conductors) 12, 13, 24-37 on the fifth layer through twelfth layer are similar in arrangement to those in the first embodiment, these electrodes are designated the same reference numerals, and repeated descriptions thereon are omitted.

Figure 13:
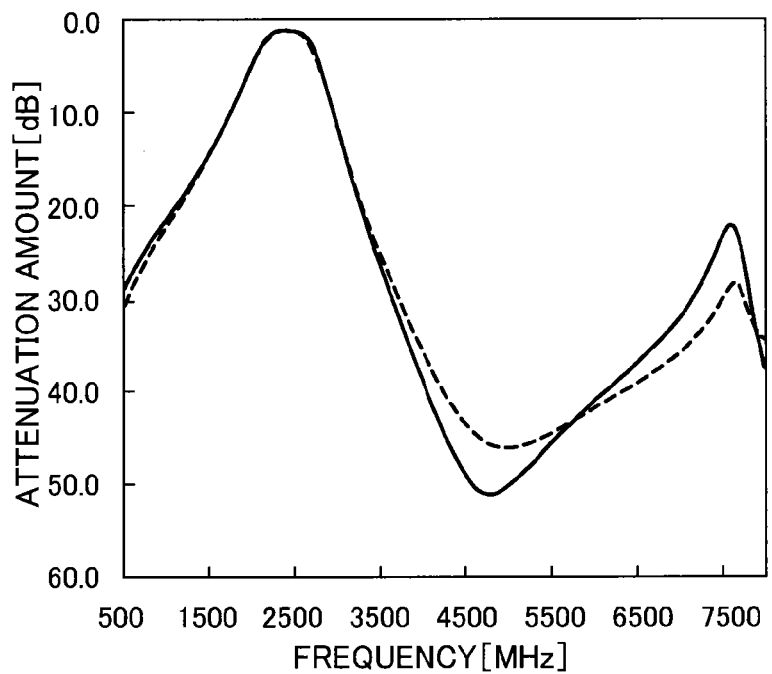
FIG. 13 is a graph representing a frequency-attenuation characteristic for the BPF according to the second embodiment, shown in comparison with that for the BPF according to the first embodiment.
Figure 14:
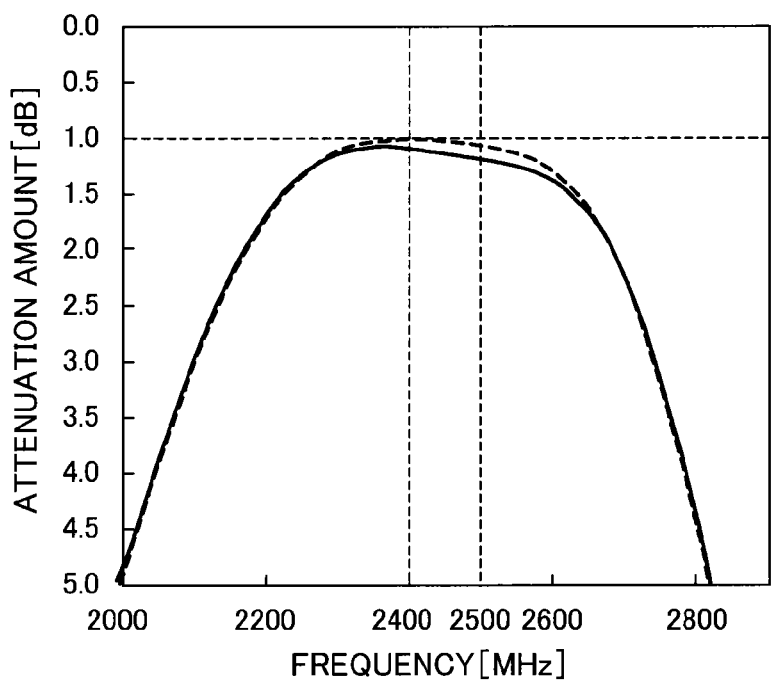
FIG. 14 is a graph representing a frequency-insertion loss characteristic for the BPF according to the second embodiment, shown in comparison with that for the BPF according to the first embodiment.
Figure 15:
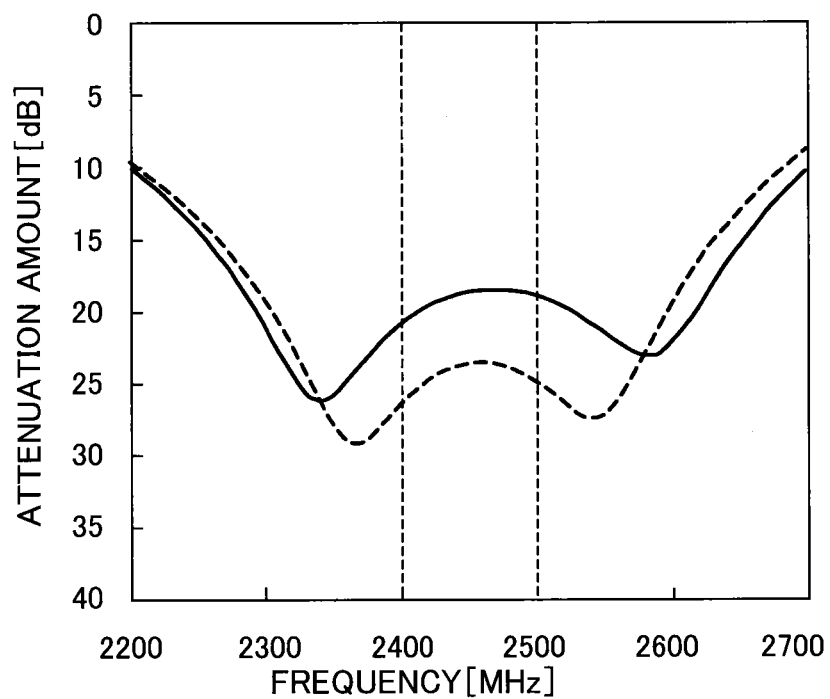
FIG. 15 is a graph representing a frequency-reflection loss characteristic for the BPF according to the second embodiment, shown in comparison with that for the BPF according to the first embodiment.

FIG. 13 through 15 show the frequency characteristic of this embodiment (solid line) together with the characteristic of the first embodiment (broken line). As is apparent from these figures, this embodiment can also provide a satisfactory characteristic substantially similar to the first embodiment, though a slight degradation is found as compared with the first embodiment.

[Third Embodiment]

Figure 16:
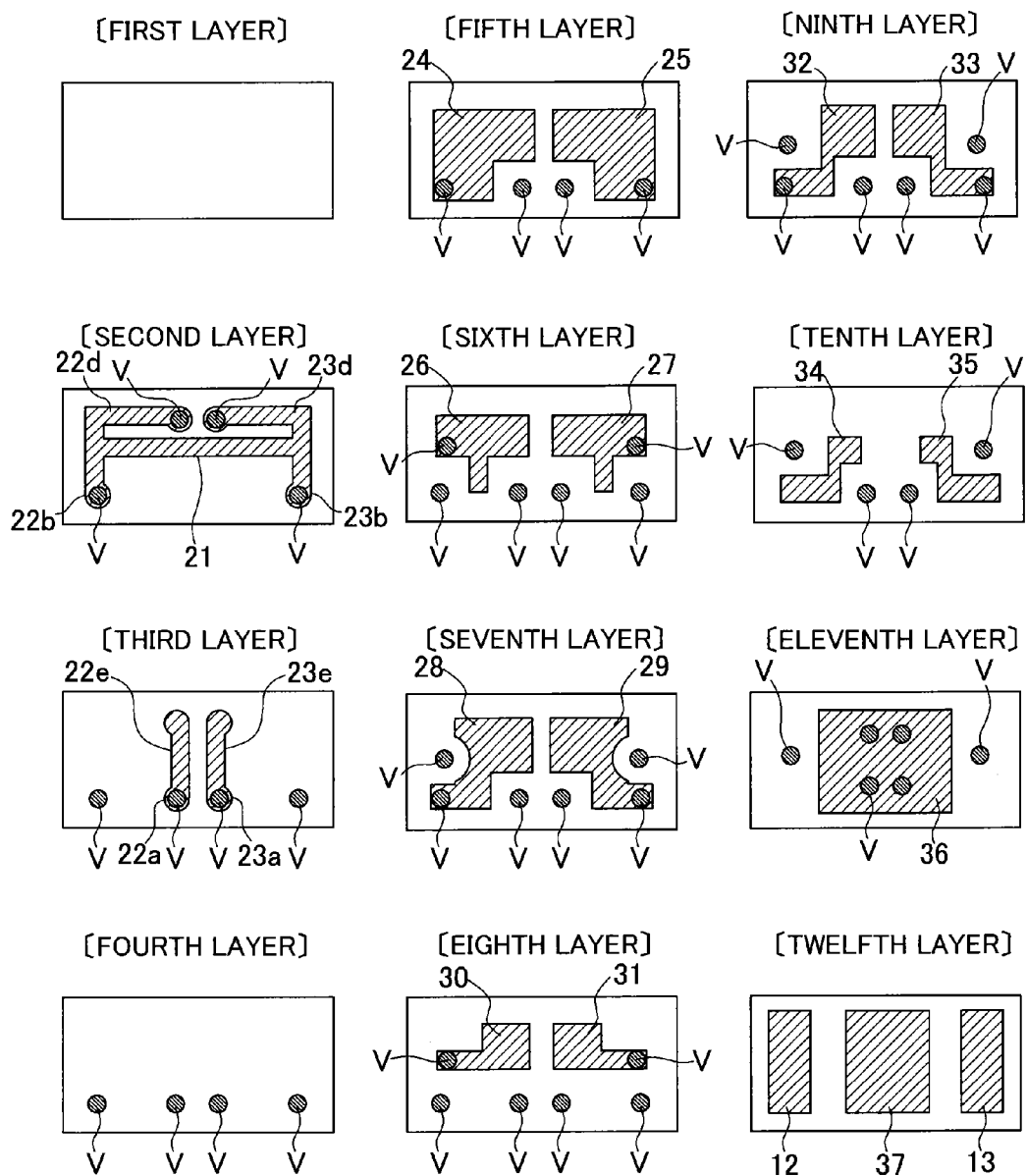
FIG. 16 is a diagram showing a laminated structure (each wiring layer of a laminate, a first through a twelfth layer) of a laminated BPF according to a third embodiment of the present invention.

A BPF according to a third embodiment of the present invention comprises LC resonators at two stages in a manner similar to the BPF according to the first embodiment, where a first inductor and a second inductor, which form part of the respective resonators, are formed of an inverted C-shaped conductor line. As shown in FIG. 16 (second layer-third layer), these inductor conductors (first inductor and second inductor) are made up of L-shaped conductors 22d, 23d disposed on the second layer, and linear conductors 22e, 23e disposed on the third layer. The L-shaped conductor on the second layer and the linear conductors 22e, 23e on the third layer are interconnected through vias V in the other marginal area included in a middle zone in the longitudinal direction of the chip (upper marginal area in FIG. 16). In this way, each inductor as a whole appears to be an inverted C-shaped inductor, when viewed in plan, similar to that of the first embodiment.

Also, the short-circuited ends 22a, 23a of the respective inductor conductors are positioned in one marginal area included in a middle zone in the longitudinal direction of the chip (lower marginal area in FIG. 16) in a manner similar to the first embodiment, while the open ends 22b, 23b are positioned in both side end areas in the longitudinal direction of the chip (left side end area and right side end area in FIG. 16), in a manner similar to the first embodiment, respectively. Then, the connection conductor 21 for coupling the first inductor and second inductor is connected at substantially the same positions as the first embodiment, however, in this embodiment, the L-shaped conductors 22d, 23d, which form part of the inductors as mentioned above, are disposed on the same wiring layer (second layer) as the connection conductor 21, where the connection conductor 21 is a conductor continuous to the L-shaped conductors 22d, 23d.

Figure 17:
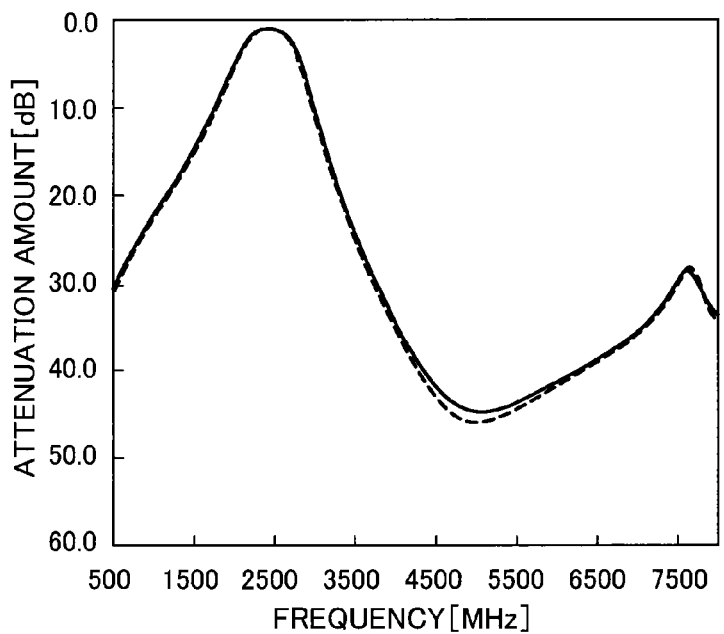
FIG. 17 is a graph representing a frequency-attenuation characteristic for the BPF according to the third embodiment, shown in comparison with that for the BPF according to the first embodiment.
Figure 18:
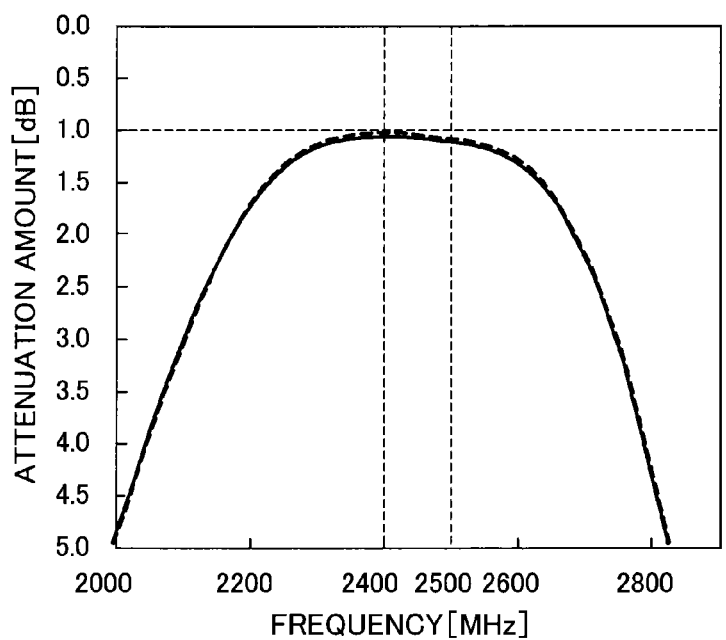
FIG. 18 is a graph representing a frequency-insertion loss characteristic for the BPF according to the third embodiment, shown in comparison with that for the BPF according to the first embodiment.
Figure 19:
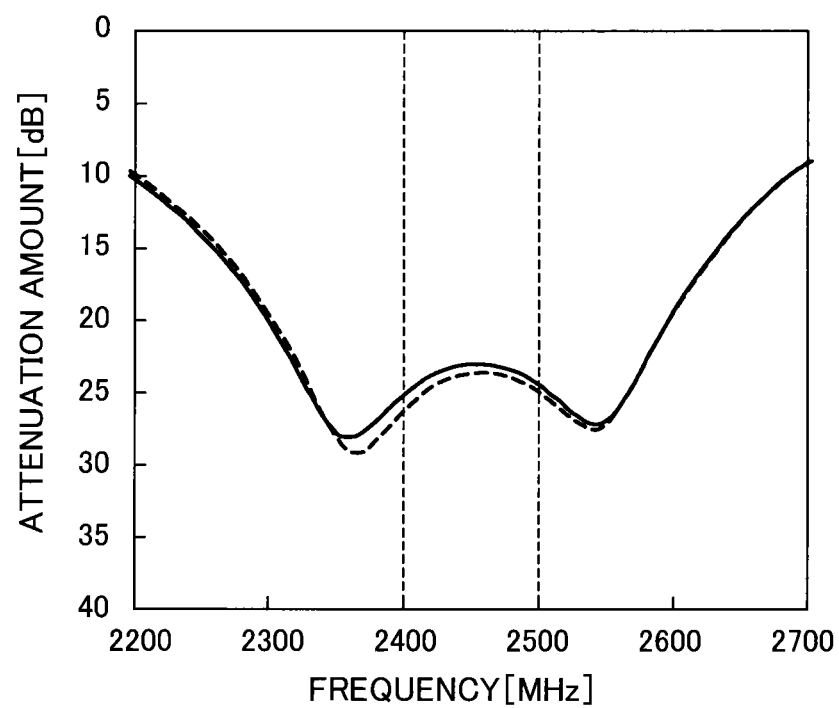
FIG. 19 is a graph representing a frequency-reflection loss characteristic for the BPF according to the third embodiment, shown in comparison with that for the BPF according to the first embodiment.

FIG. 17 through 19 show the frequency characteristic of this embodiment (solid line) together with the characteristic of the first embodiment (broken line). As is apparent from these figures, this embodiment can also provide a satisfactory characteristic substantially similar to the first embodiment, though a slight degradation is found as compared with the first embodiment.

[Fourth and Fifth Embodiments]

BPFs according to a fourth and a fifth embodiment of the present invention are such that, in the BPF according to the first embodiment, the open ends 22b, 23b of the inductors 22, 23 are exchanged in placement with the short-circuited ends 22a, 23a of the same (fourth embodiment), or one inductor (second inductor 23) is reversed in orientation (fifth embodiment).

Figure 20:
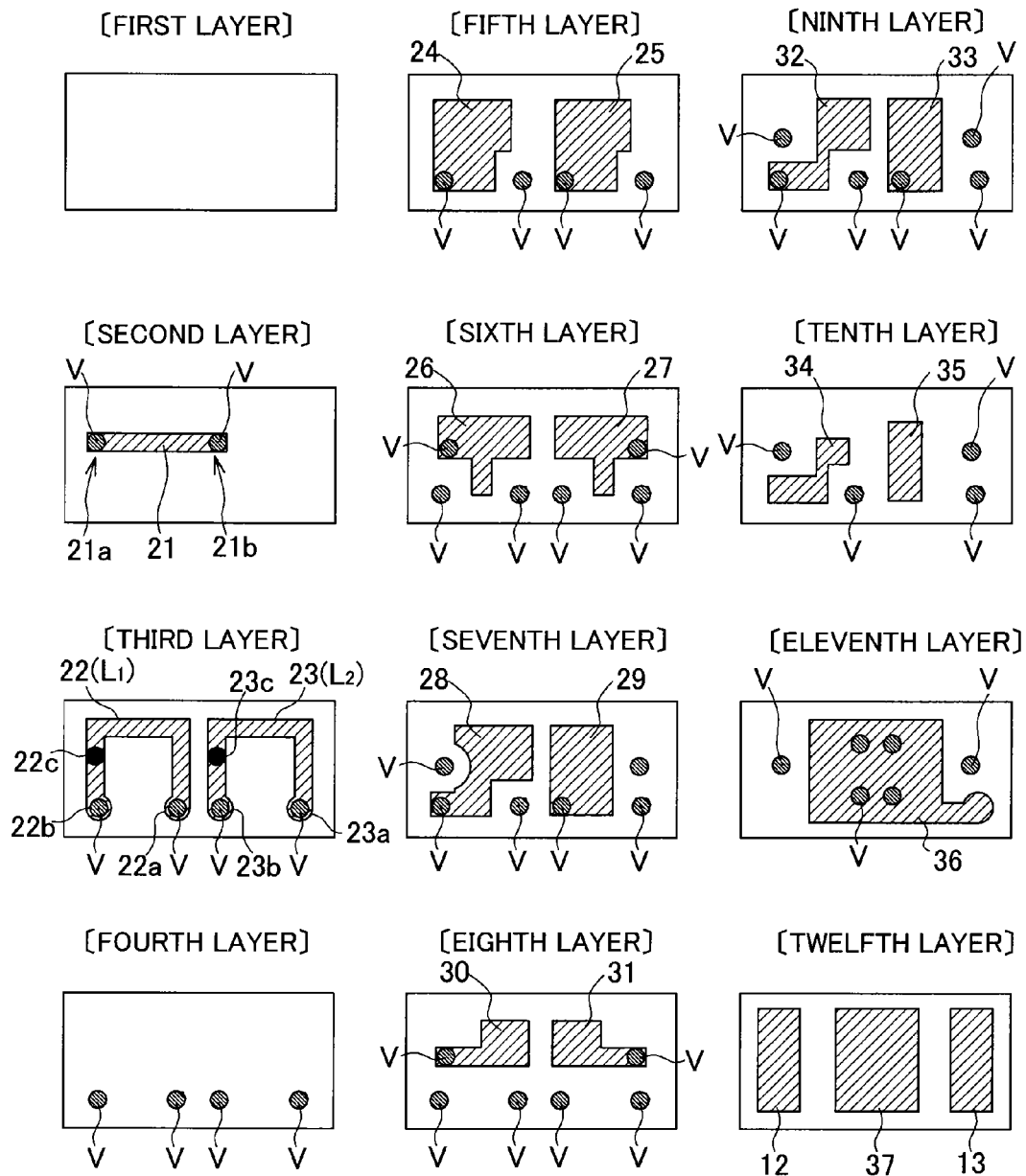
FIG. 20 is a diagram showing a laminated structure (each wiring layer of a laminate, a first through a twelfth layer) of a laminated BPF according to a fourth embodiment of the present invention.

Specifically, in the BPF according to the fourth embodiment as shown in FIG. 20, the open end 23b and short-circuited end 23a of the second inductor 23 disposed on the third layer are arranged left to right in reverse, as opposed to the first embodiment. This placement causes the open end 23b of the second inductor 23 to be positioned in the middle zone in the longitudinal direction of the chip, thus making the connection conductor 21 on the second layer shorter than that of the first embodiment. Also, capacitor electrodes 25, 27, 29, 31, 33, 35 (second capacitor and output capacitor) disposed on the right side (closer to the second resonator 23) on each of the fifth layer through tenth layer, and a ground electrode 36 disposed on the eleventh layer are changed in orientation and shape as required (similar changes are made in the fifth embodiment, next described, as well).

Figure 21:
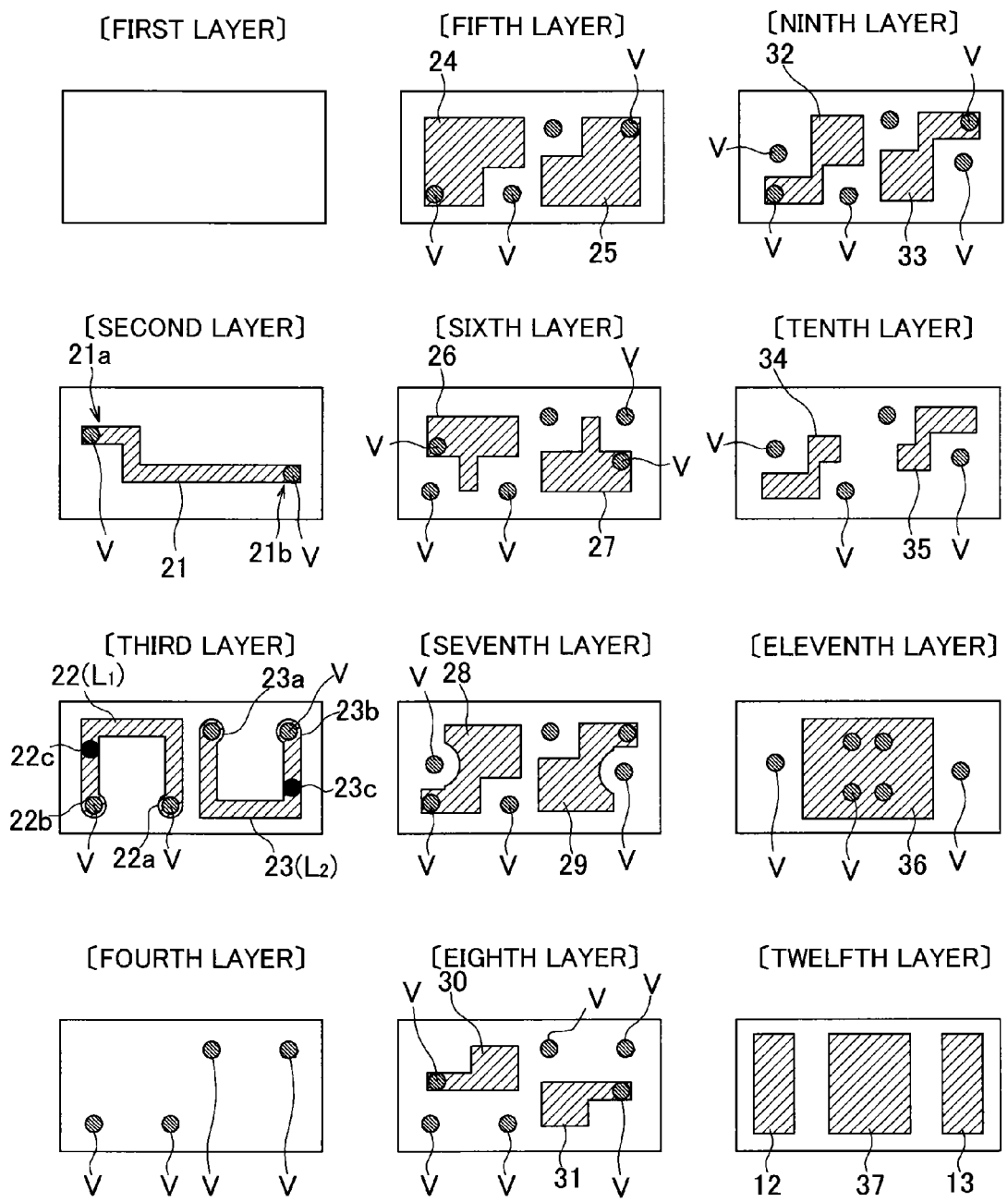
FIG. 21 is a diagram showing a laminated structure (each wiring layer of a laminate, a first through a twelfth layer) of a laminated BPF according to a fifth embodiment of the present invention.

As shown in FIG. 21, the BPF according to the fifth embodiment comprises a second inductor 23 disposed on the third layer, which is overturned upside down in the figure (the first and second inductors 22, 23 are disposed such that both inductors 22, 23 have point symmetry about the center of the chip, as viewed in plan). In association with this placement, a connection conductor 21 disposed on the second layer for connecting the first inductor 22 with the second inductor 23 is made in a hook-like bent shape. With this connection conductor 21, one end 21a thereof is connected at a position found at a certain distance away from the open end 22b of the first inductor 22 (position closer to the open end than to the middle point of the inductor) through via V, in a manner similar to the first embodiment, while the other end 21b is connected at a corresponding position 23c found at the same distance away from the open end 23b of the second inductor 23.

[Sixth Embodiment]

Figure 22:
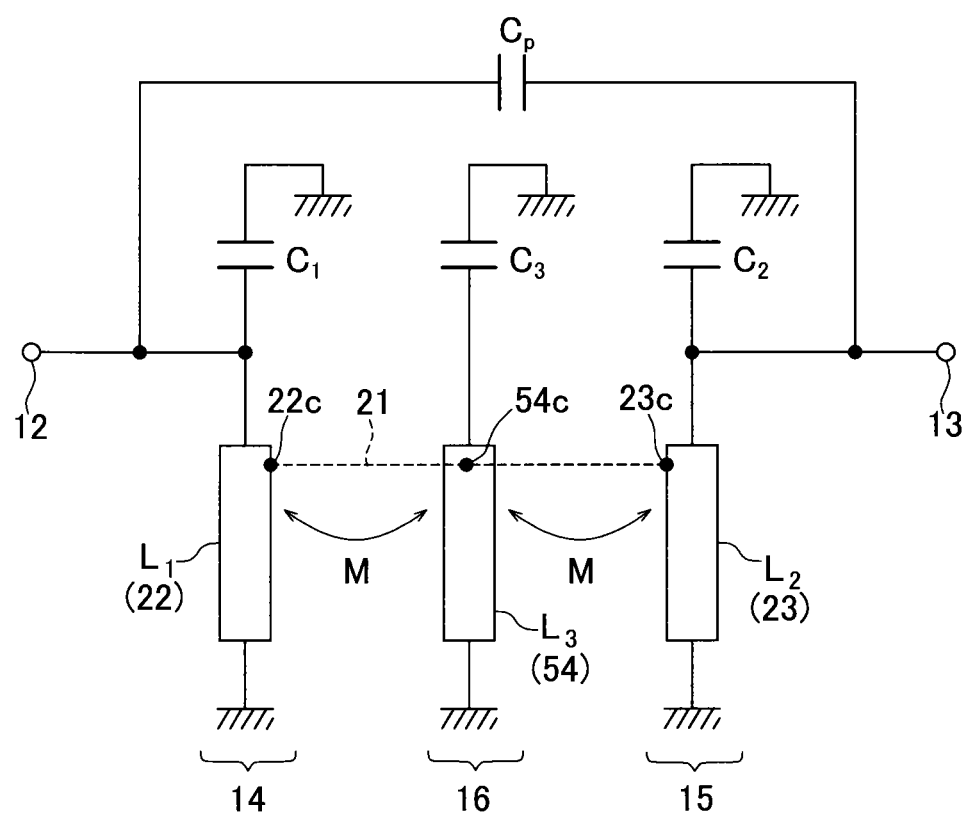
FIG. 22 is a diagram showing an equivalent circuit for a laminated BPF according to a sixth embodiment of the present invention.

A BPF according to a sixth embodiment of the present invention comprises resonators 14, 15, 16 at three stages between an input terminal 12 and an output terminal 13, as shown in FIG. 22. Specifically, the BPF comprises a first resonator 14 connected to the input terminal 12; a second resonator 15 connected to the output terminal 13, a third resonator 16 connected between these first resonator 14 and second resonator 15; and a bypass capacitor (bypass condenser) Cp connected between the input terminal 12 and output terminal 13 in parallel with these resonators 14-16. Also, the respective resonators 14-16 are LC parallel resonators which are made up of inductors L1, L2, L3 and capacitors C1, C2, C3, respectively.

In the BPF which comprises such resonators 14-16 at three stages, mutual coupling between the resonators 14-16 can also be enhanced by electrically interconnecting the respective inductors L1, L2, L3 at positions 22c, 23c, 24c close to the open ends thereof with a connection conductor 21, in a manner similar to the foregoing embodiments.

Figure 23:
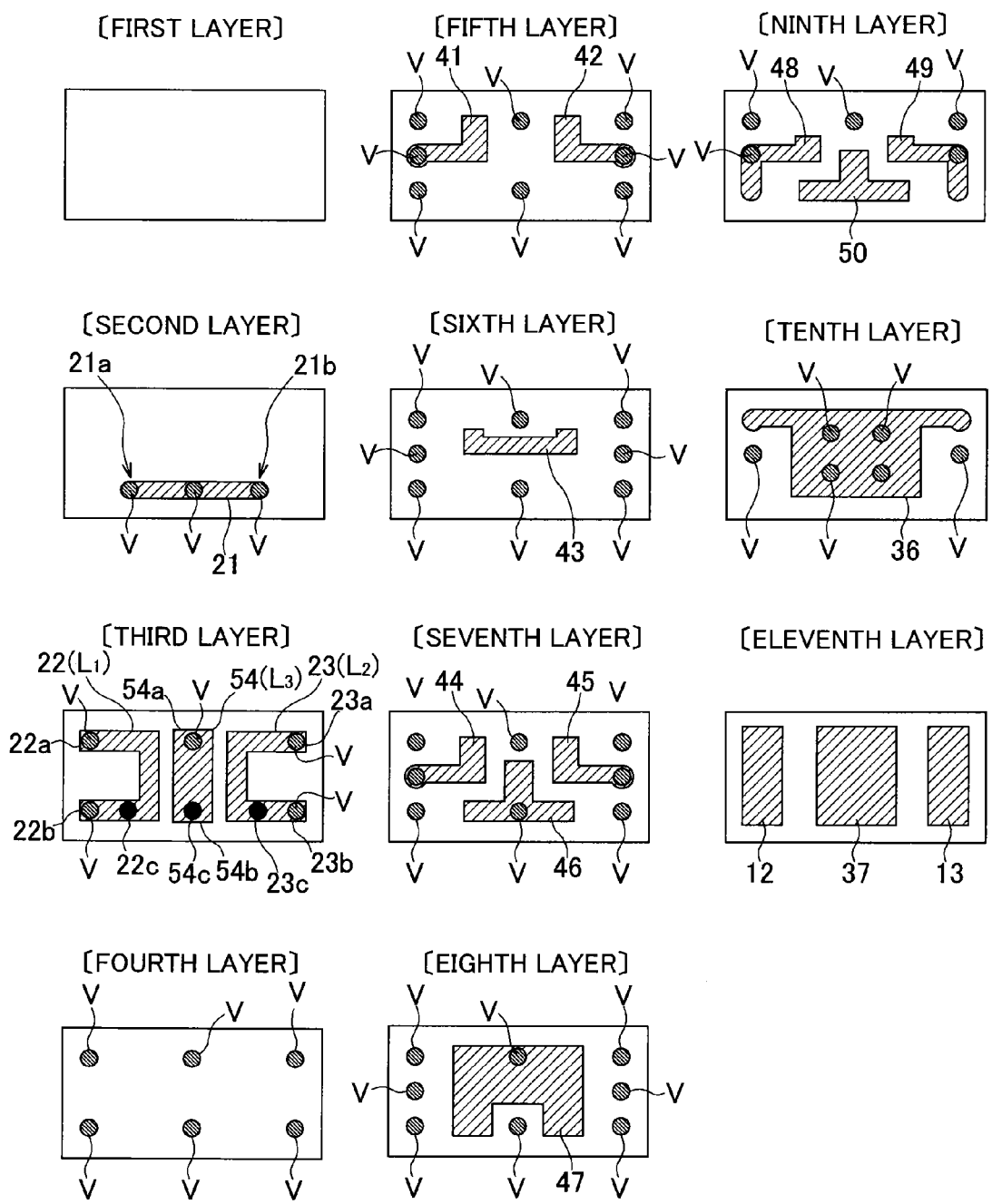
FIG. 23 is a diagram showing a laminated structure (each wiring layer of a laminate, a first through an eleventh layer) of the laminated BPF according to the sixth embodiment of the present invention.

Specifically, as shown in FIG. 23, the connection conductor 21 is disposed on the second layer of the laminate, and the first inductor (inductor L1 which forms part of the first resonator 14) 22, the third inductor (inductor L3 which forms part of the third resonator 16) 23, and the second inductor (inductor L2 which forms part of the second resonator 15) are disposed on the third layer, respectively, such that they are arranged in order in the longitudinal direction of the chip. Further, the inductors 22, 23, 24 are disposed such that the open ends 22b, 23b, 24b thereof are positioned in a marginal area of the chip (lower marginal area in FIG. 23). Then, these open ends 22b, 23b, 24b may be interconnected by the connection conductor 21 disposed on the second layer through vias V.

Additionally, electrodes 41-50 are provided on the fifth layer through the ninth layer. A first capacitor C1, which is a component of the first resonator 14, is formed of the left-hand electrode 48 on the ninth layer and a ground electrode 36 on the tenth layer; and the left-hand electrode 48 on the ninth layer and the ground electrode 47 on the eighth layer. A second capacitor C2, which is a component of the second resonator 15, is formed of the right-hand electrode 49 on the ninth layer and the ground electrode 36 on the tenth layer; and the right-hand electrode 49 on the ninth layer and the ground electrode 47 on the eighth layer. A third capacitor C3, which is a component of the third resonator 16, is formed of the middle electrode 50 on the ninth layer and the ground electrode 36 on the tenth layer; and the middle electrode 46 on the seventh layer and the ground electrode 47 on the eighth layer. The bypass capacitor Cp, in turn, is formed of the electrodes 41, 42 on the fifth layer, the electrode 43 on the sixth layer, and the electrodes 44, 45 on the seventh layer.

DESCRIPTION OF REFERENCE NUMERALS

C1 First Capacitor (Capacitor of First Resonator)
C2 Second Capacitor (Capacitor of Second Resonator)
C3 Third Capacitor (Capacitor of Third Resonator)
C12 Input Capacitor
C13 Output Capacitor
Cp Bypass Capacitor
L1, 22 First Inductor (Inductor of First Resonator)
L2, 23 Second Inductor (Inductor of Second Resonator)
L3, 54 Third Inductor (Inductor of Third Resonator)
V Via Hole
11 BPF
12 Input Terminal
13 Output Terminal
14 First Resonator
15 Second Resonator
16 Third Resonator
21 Connection Conductor (Coupling Electrode)
22a, 23a, 54a Short-Circuited Ends
22b, 23b, 54b Open Ends
22c, 23c, 54c Connection Points of Connection Conductor
22d, 23d L-Shaped Conductor (Inductor Conductor)
22e, 23e Linear Conductor (Inductor Conductor)
24-35, 41-50 Capacitor Electrodes
36, 47 Ground Electrodes
37 Ground Electrode

The invention claimed is:
1. A laminated bandpass filter comprising:
a first resonator and a second resonator connected in order between an input terminal and an output terminal, wherein:
said first resonator and said second resonator each include an inductor conductor and a capacitor conductor formed in a laminate having a plurality of wiring layers insulated from one another, and
said inductor conductor of said first resonator and said inductor conductor of said second resonator are each configured with one open end and one short-circuited end,
said laminated bandpass filter further including:
a connection conductor for electrically connecting said inductor conductor of said first resonator with said inductor conductor of said second resonator, wherein:
said connection conductor connects a position by the open end of said inductor conductor of said first resonator with a position by the open end of said inductor conductor of said second resonator; said inductor conductor of said first resonator and said inductor conductor of said second resonator are respectively disposed on internal wiring layers of said plurality of wiring layers;
said connection conductor is disposed on a different internal wiring layer from said internal wiring layers on which said inductor conductor of said first resonator and said inductor conductor of said second resonator are respectively disposed within said plurality of wiring layers;
said inductor conductor of said first resonator and said inductor conductor of said second resonator, and said connection conductor are arranged such that said inductor conductors of said first and second resonators at least partially overlap with said connection conductor in a plan view; and
said connection conductor has a line width which is smaller than a line width respectively of said inductor conductor of said first resonator and said inductor conductor of said second resonator.

2. A laminated bandpass filter according to claim 1, wherein:
said connection conductor electrically connects the open end of said inductor conductor of said first resonator or a position adjacent thereto with the open end of said inductor conductor of said second resonator or a position adjacent thereto.

3. A laminated bandpass filter according to claim 1, wherein:
a distance from a position at which said connection conductor is connected to said inductor conductor of said first resonator to said open end of said inductor conductor of said first resonator is equal to or less than ⅜ of a total length of said inductor conductor of said first resonator; and
a distance from a position at which said connection conductor is connected to said inductor conductor of said second resonator to said open end of said inductor conductor of said second resonator is equal to or less than ⅜ of a total length of said inductor conductor of said second resonator.

4. A laminated bandpass filter according to claim 1, wherein:
said inductor conductor of said first resonator and said inductor conductor of said second resonator are arranged to be adjacent to each other on a same internal wiring layer of said plurality of wiring layers in a plan view, such that said inductor conductors of said first and second resonators are magnetically coupled to each other.

5. A laminated bandpass filter according to claim 1, wherein:
said inductor conductor of said first resonator and said inductor conductor of said second resonator each comprise a quarter wavelength line having a generally loop-like shape; and
said inductor conductors are arranged adjacent to each other on a same internal wiring layer of said plurality of wiring layers such that said inductor conductors of said first and second resonators are magnetically coupled to each other.

6. A laminated bandpass filter according to claim 1, further comprising:
one or more additional resonators connected between said first resonator and said second resonator,
wherein a pass band is formed by said first resonator, said second resonator, and said one or more additional resonators.

7. A laminated bandpass filter comprising:

a first resonator and a second resonator connected in order between an input terminal and an output terminal, wherein:

said first resonator and said second resonator each include an inductor conductor and a capacitor conductor formed in a laminate having a plurality of wiring layers insulated from one another, and said inductor conductor of said first resonator and said inductor conductor of said second resonator are each configured with one open end and one short-circuited end, said laminated bandpass filter further including:

a connection conductor to electrically connect said inductor conductor of said first resonator with said inductor conductor of said second resonator, wherein:

said connection conductor connects a position by the open end of said inductor conductor of said first resonator with a position by the open end of said inductor conductor of said second resonator;

said input terminal and said output terminal are disposed on a lowermost wiring layer of said plurality of wiring layers; said inductor conductor of said first resonator and said inductor conductor of said second resonator are respectively disposed on internal wiring layers of said plurality of wiring layers;

the capacitor conductor of said first resonator and the capacitor conductor of said second resonator are disposed on internal wiring layers of said plurality of wiring layers located below said internal wiring layers on which said inductor conductor of said first resonator and said inductor conductor of said second resonator are respectively disposed; and said connection conductor is disposed on an internal wiring layer of said plurality of wiring layers located above the internal wiring layers on which said inductor conductor of said first resonator and said inductor conductor of said second resonator are disposed.

8. A laminate bandpass filter according to claim 7, further comprising:

one or more additional resonators connected between said first resonator and said second resonator, wherein a pass band is formed by said first resonator, said second resonator, and said one or more additional resonators.

9. A laminate bandpass filter according to claim 7, wherein:

said inductor conductor of said first resonator and said inductor conductor of said second resonator each comprise a quarter wavelength line having a generally loop-like shape; and said inductor conductors of said first and second resonators are arranged adjacent to each other on a same internal wiring layer of said plurality of wiring layers such that said inductor conductors are magnetically coupled to each other.

10. A laminated bandpass filter according to claim 7, wherein:

said inductor conductor of said first resonator and said inductor conductor of said second resonator are arranged to be adjacent to each other on a same internal wiring layer of said plurality of wiring layers in a plan view, such that said inductor conductors of said first and second resonators are magnetically coupled to each other.

11. A laminated bandpass filter according to claim 7, wherein:

said inductor conductor of said first resonator and said inductor conductor of said second resonator, and said connection conductor are arranged such that said inductor conductors of said first and second resonators at least partially overlap with said connection conductor in a plan view; and said connection conductor has a line width which is smaller than a line width respectively of said inductor conductor of said first resonator and said inductor conductor of said second resonator.

12. A laminate bandpass filter according to claim 7, wherein:

said connection conductor is disposed such that said connection conductor does not overlap with either said inductor conductor of said first resonator or said inductor conductor of said second resonator in a plan view.

13. A laminated bandpass filter according to claim 7, wherein:

said connection conductor electrically connects the open end of said inductor conductor of said first resonator or a position adjacent thereto with the open end of said inductor conductor of said second resonator or a position adjacent thereto.

14. A laminated bandpass filter according to claim 7, wherein:

a distance from a position at which said connection conductor is connected to said inductor conductor of said first resonator to said open end of said inductor conductor of said first resonator is equal to or less than $3/8$ of a total length of said inductor conductor of said first resonator; and a distance from a position at which said connection conductor is connected to said inductor conductor of said second resonator to said open end of said inductor conductor of said second resonator is equal to or less than $3/8$ of a total length of said inductor conductor of said second resonator.

* * * * *